United States Patent
Olson et al.

(10) Patent No.: US 6,746,566 B1
(45) Date of Patent: Jun. 8, 2004

(54) TRANSVERSE MAGNETIC FIELD VOLTAGE ISOLATOR

(75) Inventors: James Daniel Olson, San Mateo, CA (US); Jeffery Scott Coffer, Scotts Valley, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 69 days.

(21) Appl. No.: 10/114,022

(22) Filed: Mar. 29, 2002

Related U.S. Application Data

(60) Provisional application No. 60/339,487, filed on Dec. 11, 2001.

(51) Int. Cl.[7] .......................... C23F 1/00; H01L 21/306
(52) U.S. Cl. .................. 156/345.29; 250/311; 335/210; 156/345.28
(58) Field of Search ..................... 156/345.29; 118/733; 250/311

(56) References Cited

U.S. PATENT DOCUMENTS

| | | | | |
|---|---|---|---|---|
| 4,117,323 A | * | 9/1978 | Greer et al. | 250/311 |
| 5,928,426 A | * | 7/1999 | Aitchison | 118/715 |
| 6,030,486 A | * | 2/2000 | Loewenhardt et al. | 156/345.46 |
| 6,206,971 B1 | * | 3/2001 | Umotoy et al. | 118/715 |
| 6,214,161 B1 | * | 4/2001 | Becker et al. | 156/345.48 |
| 6,471,822 B1 | * | 10/2002 | Yin et al. | 156/345.49 |
| 6,571,821 B2 | * | 6/2003 | Matte et al. | 137/375 |
| 2001/0032591 A1 | * | 10/2001 | Carducci et al. | 118/723 E |
| 2002/0185067 A1 | * | 12/2002 | Upham | 118/715 |

* cited by examiner

Primary Examiner—P. Hassanzadeh
Assistant Examiner—Karla Moore
(74) Attorney, Agent, or Firm—Beyer Weaver & Thomas, LLP

(57) ABSTRACT

A voltage-isolating passageway for providing high voltage isolation between a component maintained at high DC voltage and a component maintained at a substantially lower voltage is described. The voltage-isolating passageway incorporates a transverse magnetic field across its passageway, which reduces the potential energy of charged particles (e.g., electrons) passing through the passageway. The reduction in electron potential energy reduces the energy of collisions between electrons and molecules and therefore reducing the likelihood of avalanche ionization. The voltage-isolating passageway includes a passageway and at least two magnets. The passageway has two openings and the two magnets are positioned along opposite and exterior surfaces of the passageway wherein the first and second magnets impose a magnetic field in a transverse direction with respect to a lengthwise axis of the passageway. In addition, a semi-conductive coating can be applied to the interior passageway surface to help remove potential energy from the gas that comes in direct contact with the coating.

26 Claims, 4 Drawing Sheets

TRANSVERSE MAGNETIC FIELD VOLTAGE ISOLATOR

This application claims priority of U.S. Provisional Patent Application No. 60/339,487, filed Dec. 11, 2001 entitled "Transverse Magnetic Field Voltage Isolator," which is hereby incorporated by reference.

CROSS-REFERENCE TO RELATED APPLICATIONS

This application is related to U.S. patent application Ser. No. 10/052,307, entitled "Scanning Electron Microscope Architecture and Related Material Handling System", which was filed on the same date herewith, the content of which is hereby incorporated by reference.

FIELD OF THE INVENTION

The present invention relates generally to voltage isolation, and more specifically to magnetic voltage isolation techniques.

BACKGROUND OF THE INVENTION

Avalanche ionization is a physical phenomenon that significantly decreases the operating voltage range of various low-pressure systems. Avalanche ionization typically occurs in low-pressure, gas-filled environments when high potential electrons collide into and break apart molecules into atoms and additional high potential electrons. The additional high potential electrons, in turn, take part in a chain reaction in which more and more molecules are broken apart. This chain reaction causes the gas to change into highly conductive plasma.

Avalanche ionization is problematic, for example, in low-pressure applications (e.g., less than 10 Torr) in which a component that is maintained at a high voltage is separated from another component, which is maintained at ground potential, by a gas-filled passageway. When avalanche ionization occurs within the gas-filled chamber, the created plasma forms an electrical pathway between the separated components, which drains the voltage from the high-voltage component. The plasma effectively short circuits the components and prevents high-voltage operation.

Exemplary applications of low-pressure applications include semiconductor fabrication systems, electron microscopes, and space-based ion propulsion systems. In semiconductor fabrication systems, the wafer and the chuck holding the wafer are maintained at very high voltages, typically in the range of thousands of volts, and a connected vacuum pump is at ground potential. In electron microscopes, the microscope is maintained at a high voltage and a connected vacuum pump is at ground potential. In the case of an ion engine, an ion source, typically maintained at a high voltage, is connected to a gas-feed system at ground potential. In each type of system, it is desirable to prevent avalanche conditions by increasing the threshold voltage at which plasma ionization occurs.

Currently, approaches for preventing avalanche ionization have been implemented. However, these techniques have certain drawbacks that leave the industry wanting for a more superior method. For instance, one current technique involves separating the high voltage source and the nearest ground by a large distance. This technique is impractical, however, because the necessary distances are typically infeasible in light of physical space limitations. Another technique involves separating the high voltage component and the grounded component by forming part of the gas chamber that connects the components with an electrically insulating material. Unfortunately, this technique is simply not very effective in reducing the breakdown threshold voltage. Yet another technique involves placing a porous dielectric material in the line between the high voltage component and the grounded component to obstruct the path in which high potential electrons can travel. The dielectric material reduces the potential of the electrons, however, it also significantly impedes the flow of gas. In the case where the bias is of an A/C nature, a faraday cup has been used with limited success.

In view of the foregoing, techniques for effectively increasing the voltage level at which avalanche ionization occurs in low-pressure applications would be desirable.

BRIEF SUMMARY OF THE INVENTION

The present invention is directed to techniques for increasing the voltage level at which avalanche ionization occurs in low-pressure applications. The invention essentially creates a transverse magnetic field across a gas passageway, which reduces the potential energy of charged particles (e.g., electrons) passing through the passageway. The reduction in electron potential energy reduces the energy of collisions between electrons and molecules and therefore reduces the likelihood of avalanche ionization.

One aspect of the invention pertains to a voltage-isolating passageway that includes a passageway and two magnets. The passageway has two openings, each opening configured to be connected to external components and capable of being sealed such that a low pressure environment can be sustained within the passageway. The first and second magnets are positioned along opposite and exterior surfaces of the passageway wherein the first and second magnets impose a magnetic field in a transverse direction with respect to a lengthwise axis of the passageway, the transverse magnetic field tending to reduce the potential energy of charged particles traveling through the passageway. In another aspect of this invention, a semi-conductive material layer that coats an inner surface of the passageway. The semi-conductive material layer is suitable for absorbing at least some of the charged particles that travel through the passageway and conducting their potential safely to ground.

Another aspect of the present invention pertains to a high voltage system having at least two components that are each maintained at different voltage biases. The system includes a vacuum chamber, a vacuum pump, and a voltage isolating passageway. The vacuum chamber is maintained at a very high electrical potential while the vacuum pump is maintained at substantially a ground potential and creates a vacuum within the vacuum chamber. The voltage isolating passageway connects the vacuum chamber and the vacuum pump and includes a passageway and magnets as described in the first aspect of the invention.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to techniques for increasing the breakdown threshold voltage at which avalanche ionization can occur within low-pressure environments. One specific implementation of the invention involves providing high voltage isolation between a vacuum chamber and a vacuum pump in pressure range of approximately 1 milliTorr–1 Torr with little or no current load on the voltage source and without impeding the flow of gas from a vacuum chamber to a vacuum pump. The invention creates a transverse magnetic field across a gas passageway, which reduces the potential energy of charged particles (e.g., electrons) passing through the passageway. The reduction in electron potential energy reduces the energy of collisions between electrons and molecules and therefore the likelihood of avalanche ionization. For descriptions of implementations using the voltage-isolation system of the present invention, see U.S. patent application Ser. No. 10/052,307, entitled "Scanning Electron Microscope Architecture and Related Material Handling System."

Figure 1:
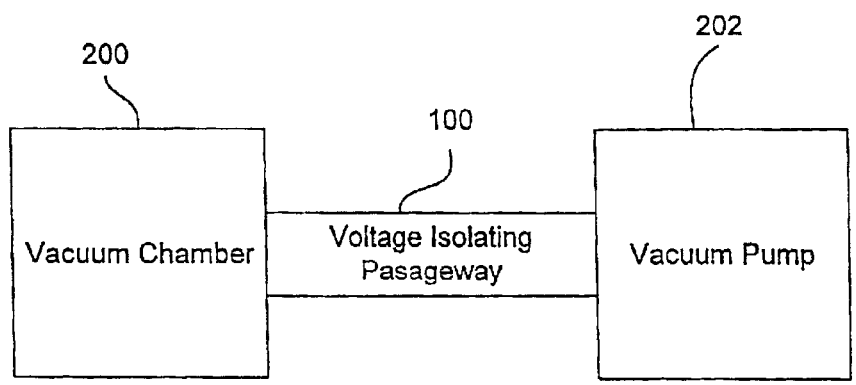
FIG. 1 illustrates a block diagram showing the basic concept wherein voltage-isolation passageway system connects two components.

FIG. 1 illustrates a block diagram showing the basic arrangement in which a voltage isolating passageway system 100 of the present invention can be utilized. In FIG. 1, passageway system 100 connects two components 200 and 202. In a specific embodiment, component 200 is a vacuum chamber and component 202 is a vacuum pump that pumps down the pressure of vacuum chamber 200 through passageway system 100. Various devices can operate within vacuum chamber 200. For example, a scanning electron microscope or a semiconductor-manufacturing device can operate within vacuum chamber 200. Typically, the device within vacuum chamber 200 is biased at a very high voltage while vacuum pump 202 is grounded at substantially 0 Volts. For example, a typical electron microscope may operate at −5000 Volts. Voltage-isolating system 100 acts to substantially prevent current flow between components 200 and 202 so that the components do not short-circuit each other.

Figure 2:
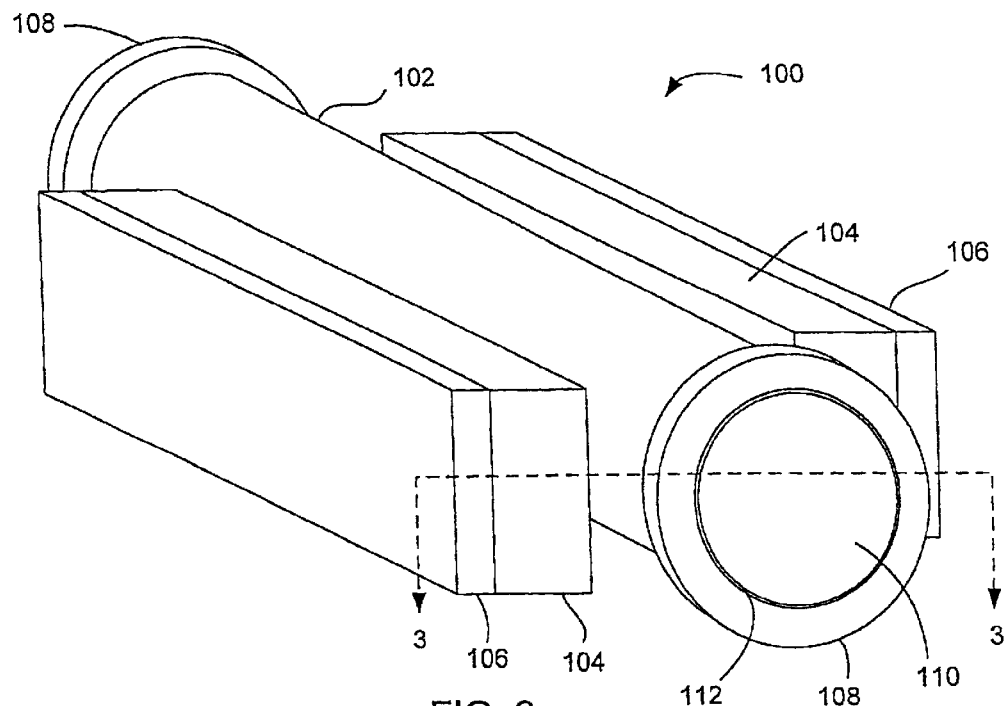
FIG. 2 illustrates a perspective view of a voltage-isolating passageway system according to one embodiment of the present invention.
Figure 3:
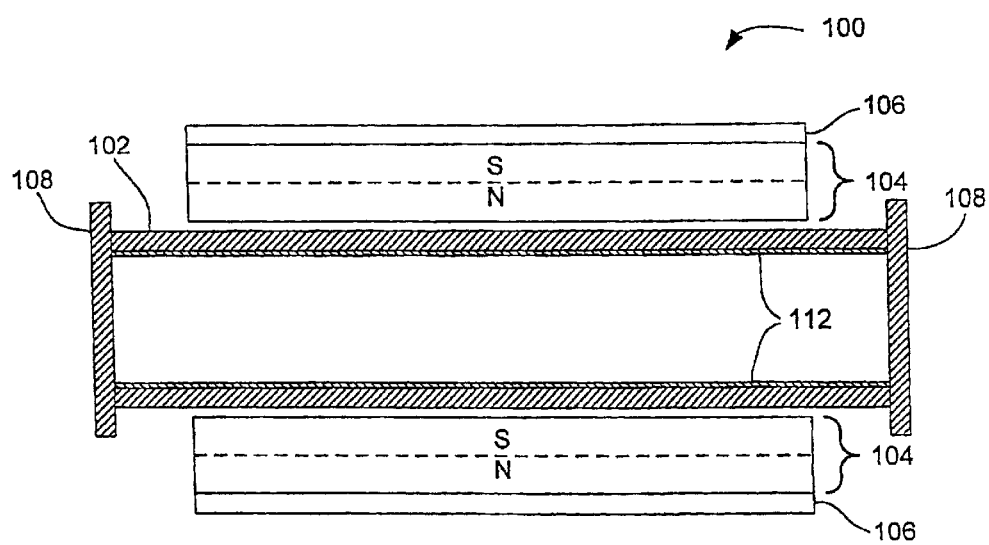
FIG. 3 illustrates a cross-sectional view of system along line 3—3 in FIG. 2.

FIG. 2 illustrates a perspective view of voltage isolating passageway system 100 of FIG. 1, according to one embodiment of the present invention. FIG. 3 illustrates a cross-sectional view of system 100 along line 3—3 in FIG. 2. Passageway system 100 includes a passageway 102 and two magnets 104 positioned about the outer walls of passageway 102. Passageway 102 has a seal 108 at each opening 110. Pole pieces 106 are attached to the outside surfaces of magnets 104. The inner surface of passageway 102 is coated with a semi-conductive coating 112.

Passageway 102 is a tube through which gas can travel. Seals 108 help maintain the vacuum created within the chambers connected by passageway 102. Seals 108 can be, for example, O-ring seals. Passageway 102 can be of a variety of shapes even though, for exemplary purposes, passageway 102 is shown to have a tubular configuration. Passageway 102 is preferably made of electrically non-conductive materials such as polycarbonate materials.

As seen in FIG. 3, magnets 104 are bar magnets that are oriented so that their poles face the same direction. In this orientation, opposite poles of each magnet 104 face each other and across passageway 102. The north and south poles that face each other across passageway 102 create a magnetic field in the direction transverse to the length of passageway 102. As will be describe in more detail below, the transverse magnetic field will reduce the potential energy of free electrons moving through passageway 102 since it applies a force that is orthogonal to the electron's direction of movement. Magnets 104 can be a single bar magnet having a length equal to a substantial length of passageway 102 as shown in FIG. 3, or each magnet 104 can be substituted with a plurality of individual smaller magnets. Of course, when individual magnets are used, their poles must still be oriented so that opposite poles face each other across passageway 102. Magnets 104 are permanent magnets, however, electrically powered magnets could also be used. Magnets 104 can be made of rare earth materials. In general, the length and strength of the magnetic field dictate the amount of voltage isolation that can be achieved. Longer fields and stronger magnets both produce higher levels of voltage isolation. For particular applications that require less voltage isolation, shorter magnets can be used. For the application of an electron microscope, magnets 104 create a transverse magnetic field of at least 2250 Gauss. Magnetic fields stronger than 2250 Gauss can provide higher levels of voltage isolation, thereby allowing isolated components to operate at voltages greater than 7000 Volts DC.

Pole pieces 106 are attached to the outer surface of magnets 104 in order to direct the magnetic field direction in the transverse direction with respect to the length of passageway 102. Pole pieces can be formed of iron or other suitable materials and alloys.

Semi-conductive coating 112 has a very high resistance that keeps any current flow between each end of passageway 102 to a minimum. Coating 112 gives passageway 102 an end-to-end nominal resistance of approximately 115 Mega Ohms. This corresponds to a nominal surface resistance of 60 Mega Ohms square. Preferably, coating 112 is a mixed metal oxide in an acrylic polymer carrier. The acrylic polymer carrier prevents evaporation and contamination of coating 112. The end-to-end resistance of passageway 102 can vary depending upon the characteristics of coating 112. For instance, the use of various materials can affect the resistance of coating 112. Semi-conductor coating 112 can be applied to the inner surface of passageway 102 by spray application techniques.

In an embodiment of system 100 in which passageway 102 is used to connect a vacuum chamber and a vacuum pump, passageway 102 is a polycarbonate tube that is approximately six inches long, having an outer diameter of 1.25 inches, and having a wall thickness of ⅛ inches. The magnets 104 that are mounted to passageway 102 are 12 individual magnet pieces, that are 1"×1"×0.5" in dimension, 35 grade, and formed of neodymium rare earth magnets. Each of the 12 magnets are arranged into two bar magnets wherein each of the bars are placed on one side of passageway 102. Each of the bars are created by attaching six magnets to a 6"×1"×⅜" piece of C1018 cold-rolled piece of steel. This embodiment of voltage isolation system 100 can effectively increase the threshold breakdown voltage, at any pressure, thereby allowing a high voltage system to operate at higher voltages.

Figure 4:
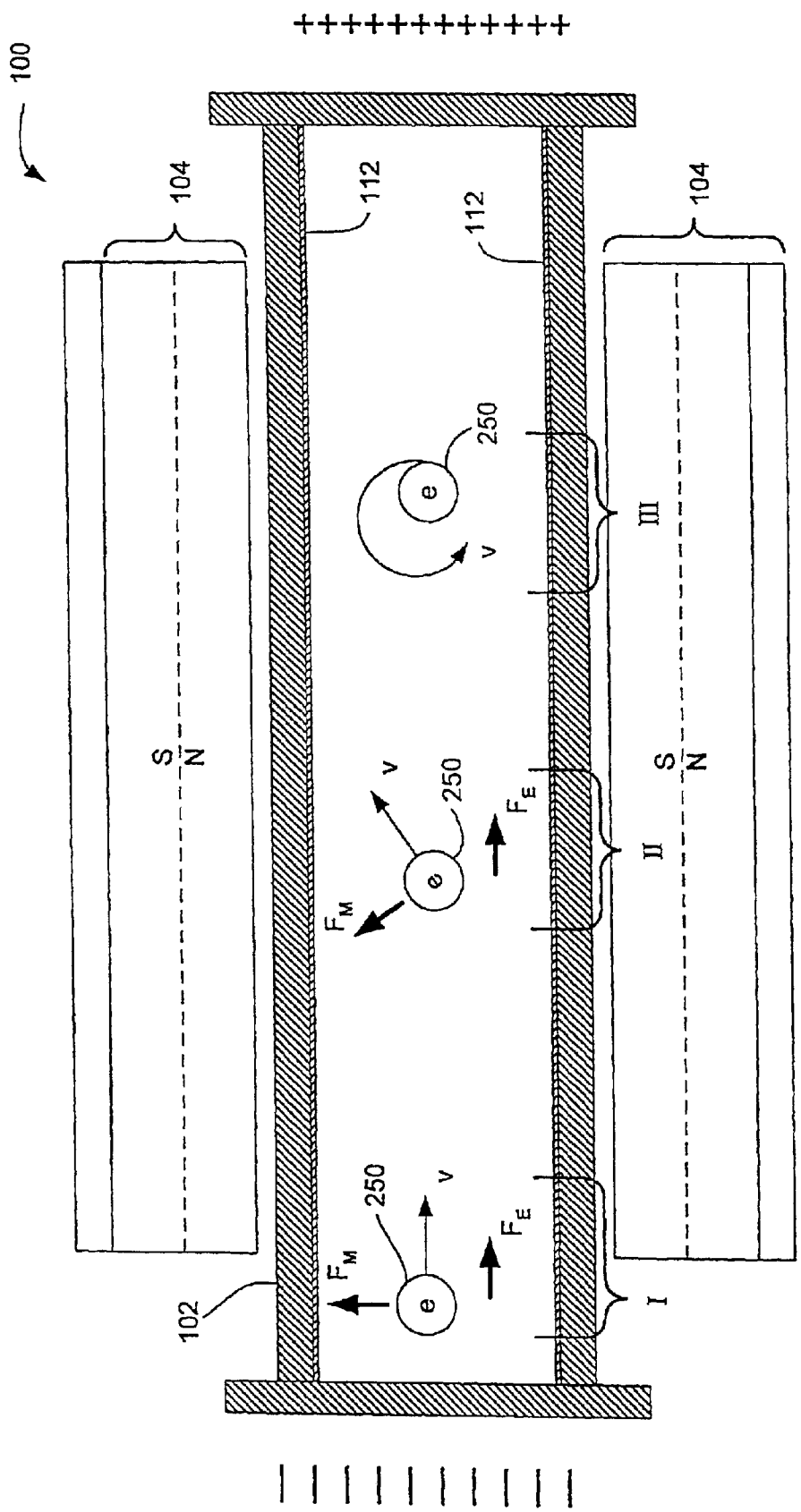
FIG. 4 presents an enlarged cross-sectional view of voltage-isolating passageway system to describe how the transverse magnetic field reduces the potential energy of the charged particles that pass through the passageway.

FIG. 4 presents an enlarged cross-sectional view of voltage-isolating passageway system 100 to describe how the transverse magnetic field reduces the potential energy of the charged particles that pass through the passageway. FIG. 4 represents a passageway system 100 wherein the left side is connected to a component that is maintained at a high negative DC voltage and the right side is connected to a component that is maintained at a ground potential. For example, the left side is connected to an electron microscope and the right side is connected to a vacuum pump. The negative and positive signs on each side of passageway 102 represent the negative and ground potentials. Both the suction of the pump and the electrical force, $F_E$, caused by the electrical bias across the passageway 102, accelerate free electrons along the longitudinal axis and from the left to the right end of passageway 102. These forces cause electrons to travel at very high speeds, and therefore, to have very high potential energies. Again, avalanche ionization is caused when these electrons begin to collide and break apart molecules, thereby creating more high energy electrons that will break apart additional molecules.

A single electron 250, progressing through three basic stages (I, II, and III), is shown within passageway 102 to describe how the transverse magnetic field, $F_M$, reduces the potential energy of the traveling electrons. Stage I, represents the initial stage in which electron 250 enters passageway 102 and is accelerated towards the right end of passageway 102 such that it has a velocity, v. Upon entering passageway 102, electron 250 has a velocity, v, that is substantially in the direction of the passageway's longitudinal axis. However, as shown in stage II, as electron 250 enters into the transverse magnetic field created by magnets 104, the force of the magnetic field, represented by $F_M$, accelerates electron 250 in a direction orthogonal to velocity, v. The direction of the magnetic field is represented by $F_M$. Since, the magnetic force on an electron remains orthogonal to the direction of the moving electron, magnetic force $F_M$ causes electron 250 to move in a cyclical path while traveling through passageway 102. Stage III represents the cyclical path in which electron 250 travels, as caused by $F_M$. While travelling in the cycloidic path, the electron is accelerated for one half of the cycle and decelerated for the other half, with respect to the longitudinal axis of passageway 102. As a result, the velocity of electron 250, and therefore its potential energy is greatly reduced. Collisions with the spinning electron 250 now occur at greatly reduced energy. This reduces the possibility that a collision between electron 250 and a molecule would result in the beginning of avalanche ionization.

Semi-conductive coating 112 also detracts from avalanche ionization conditions by absorbing electrons that make contact with the coating, thus reducing the amount of potential energy available. Note that the transverse magnetic force increases the number of electrons that will make contact with coating 112 by forcing electrons towards one side of the inner surface of passageway 102. Effectively, semi-conductive coating 112 reduces the total number of free electrons within the gas, thereby reducing the number electron/molecule collisions. Semi-conductive coating 112 provides a high impedance and direct current path for the absorbed electrons in which the electrons can be conducted toward the ground potential in a controlled and predictable manner. The impedance of coating 112 is sufficiently large that the flow of current through passageway 102 causes only a negligible drop in voltage between the components on either end of system 100.

Voltage-isolating system 100 is effective with or without semi-conductive coating 112. However, for significantly higher voltage isolation, it is preferable to utilize both the magnets 104 and the semi-conductive coating 112. In some embodiments, passageway 102 can be extruded with a conductive doping so that the need to coat the passageway with the semi-conductive coating is eliminated.

Depending upon the voltage isolation and pressure requirements of specific implementations, the length and shape of the passageway can be adjusted accordingly. Also, the field strength and the arrangement of the magnetic poles can be positioned to obtain different levels of voltage isolation.

The effectiveness of the voltage-isolation passageway system of the invention allows the passageway connecting a vacuum chamber and a vacuum pump to be relatively short in length and presents no significant impedance of the flow of the gas. This is particularly advantageous in conditions where space, for example, in a manufacturing plant, is at a premium.

Figure 5:
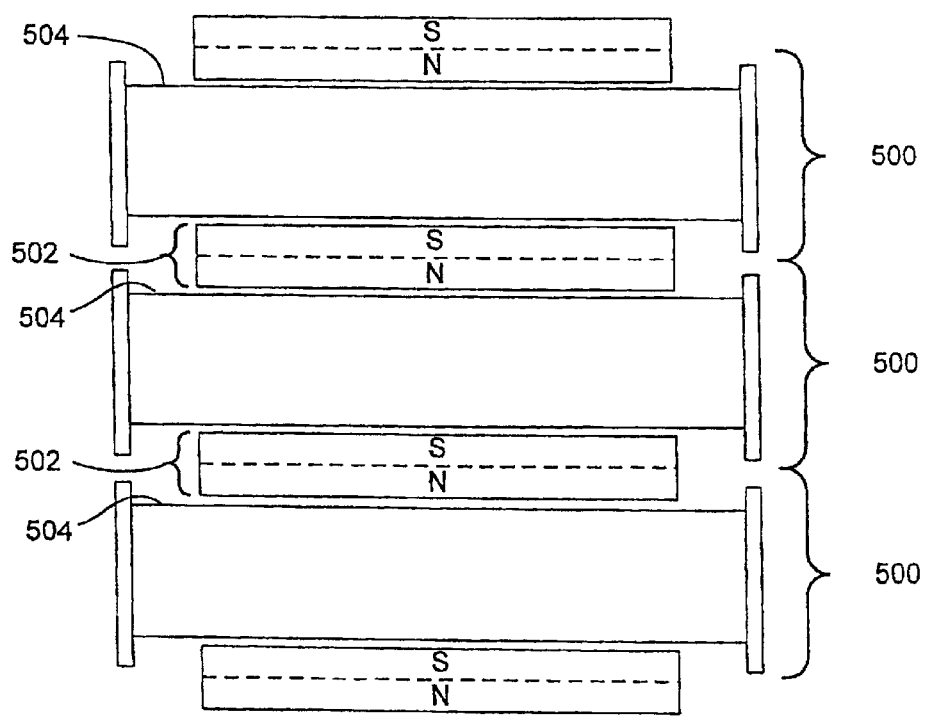
FIG. 5 illustrates an alternative embodiment of the present invention in which three voltage-isolation passageway systems are aligned in parallel.

FIG. 5 illustrates an alternative embodiment of the present invention in which three voltage-isolation passageway systems 500 are aligned in parallel. The arrangement in FIG. 5 is useful in systems in which different levels of low-pressure environments are maintained during the operation of a vacuum system. For instance, each passageway 504 can connect a respective vacuum pump to a respective vacuum chamber. In the parallel arrangement, the north and south poles of each magnet 502 are positioned to face adjacent passageways 504. With this arrangement, it is no longer necessary to have a pole piece for each magnet.

For description of an implementation using the voltage-isolation passageway system of the present invention, see U.S. patent application Ser. No. 10/052,307, entitled "Scanning Electron Microscope Architecture and Related Material Handling System."

Figure 6:
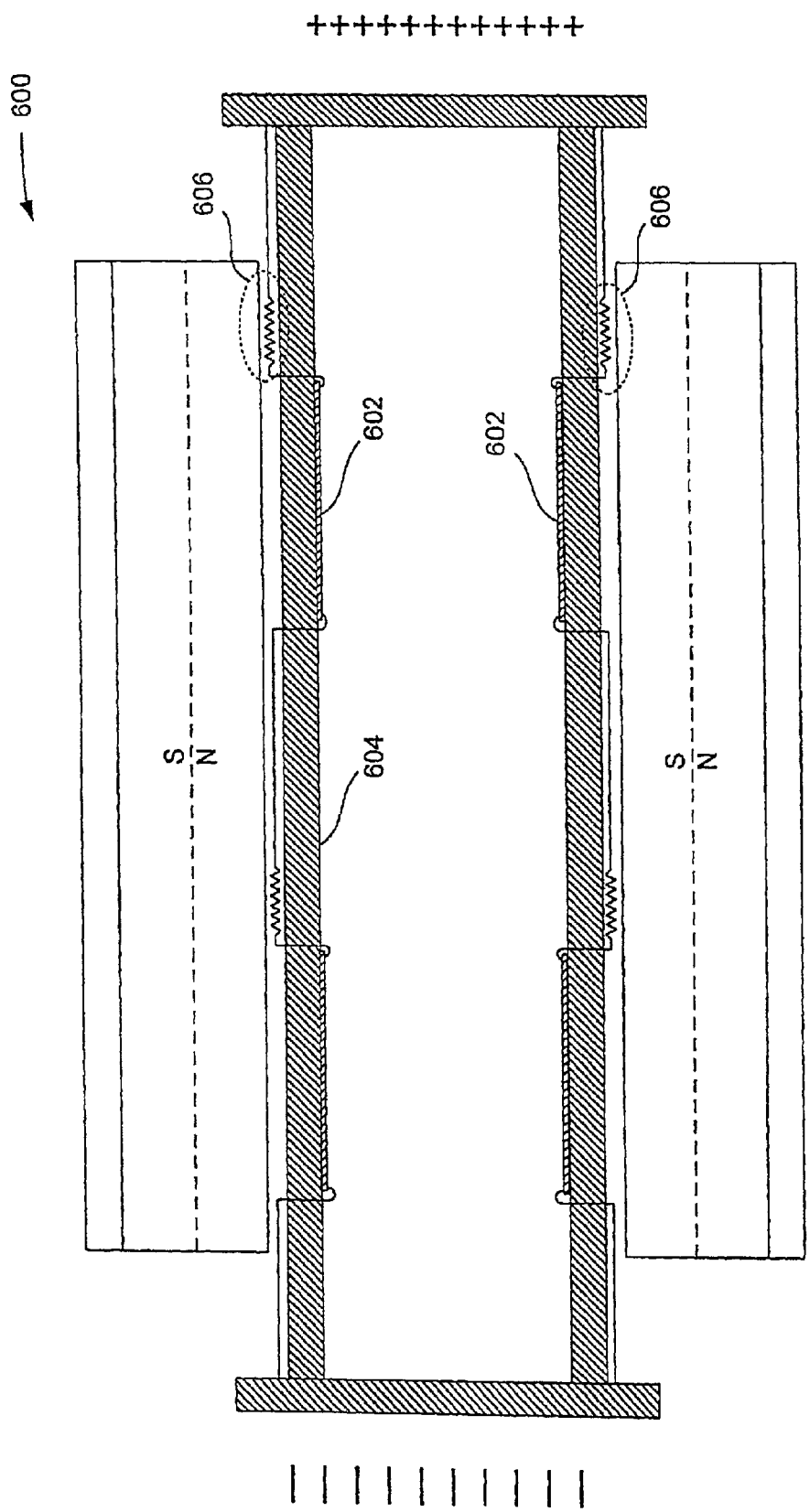
FIG. 6 illustrates a voltage isolation passageway system according to another alternative embodiment of the invention.

FIG. 6 illustrates a voltage isolation passageway system 600 according to another alternative embodiment of the invention. System 600 has a series circuit of discrete strips of semi-conductive coating 602 on the inner surface of passageway 604 that are connected to external resistors 606. The series circuitry connects the opposite ends of passageway 102 such that the voltage drop occurs in measured amounts along the length of passageway 102 as determined by resistors 606. As with the semi-conductive coating that covers the entire length of the passageway, the discrete strips of semi-conductive coating 602 also collect free electrons so to remove them from the flowing gas. In this configuration the bias potential can be actively monitored along the length of the pathway.

An alternative application of the invention utilizes a magnetic field to isolate selected regions of a substrate from plasma formed through avalanche ionization. This application relates to the industrial plastics industry, which uses plasma as a means to modify the surface of a substrate in order to enhance the bonding of an unlike and or incompatible material to their product, i.e. paint on plastic, Teflon coating on silicon rubber, ect. In some cases it is necessary to shield a portion of the whole substrate from the effects of the plasma chemistry. A magnetic field could be easily adapted to any shape and likewise and be positioned to prevent a plasma from being formed within its field, thus creating a plasma shadow zone to protect sensitive areas of the substrate from the surface modifications due to direct exposure to plasma. This process is typically achieved with masking material that is costly and labor intensive.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A voltage isolating passageway comprising:
   a passageway having two openings, each opening configured to be connected to external components and capable of being sealed such that a low pressure environment can be sustained within the passageway, wherein charged particles having a certain level of potential energy travel through the passageway;
   a semi-conductive material layer that coats an inner surface of the passageway, the semi-conductive material layer being suitable for absorbing at least some of the charged particles that come into physical contact with the inner surface of the passageway; and
   a first and a second magnet positioned along opposite and exterior surfaces of the passageway wherein the first and second magnets impose a magnetic field in a transverse direction with respect to a lengthwise axis of the passageway, the transverse magnetic field tending to reduce the potential energy of the charged particles that travel through the passageway.

2. A voltage-isolating passageway as recited in claim 1 wherein the semi-conductive material layer has resistance of at least 60 Mega-ohms Square.

3. A voltage-isolating passageway as recited in claim 1 further comprising:
   a strip of semi-conductive material attached to a portion of an inner surface of the passageway suitable for absorbing at least some of the charged particles that travel through the passageway; and
   a resistor connected to the strip of semi-conductive material, wherein the strip of semi-conductive material and the resistor are connected in series with a first end and a second end of the passageway.

4. A voltage isolating passageway as recited in claim 1 wherein the first and second magnets are oriented such that opposite poles face each other across the passageway.

5. A voltage isolating passageway as recited in claim 1 wherein the magnetic field has a strength of at least 2250 gauss within the passageway.

6. A voltage isolating passageway as recited in claim 1 further comprising a pair of pole pieces, each pole piece attached to one of the magnets whereby the pole pieces guide the magnetic field in the transverse direction.

7. A voltage isolating passageway as recited in claim 1 wherein the passageway is approximately 6 inches long.

8. A voltage isolating passageway as recited in claim 1 wherein the low pressure environment is a vacuum.

9. A voltage isolating passageway as recited in claim 1 wherein the first and second magnets are rare earth magnets.

10. A high voltage system having at least two components that are each maintained at different DC voltage biases, the system comprising:
    a vacuum chamber maintained at a very high DC electrical potential;
    a vacuum pump maintained at substantially a ground potential and configured to create a vacuum within the vacuum chamber; and
    a voltage isolating passageway that connects the vacuum chamber and the vacuum pump, the voltage isolating passageway including,
    a passageway having two openings with vacuum fitting seals, one of the openings configured to be connected to the vacuum chamber and the other opening configured to be connected to the vacuum pump such that a vacuum can be sustained within the passageway, wherein charged particles having a certain level of potential energy travel through the passageway;
    a semi-conductive material layer that coats an inner surface of the passageway, the semi-conductive material layer acting to absorb at least some of the charged particles that come into physical contact with the inner surface of the passageway; and
    a first and a second magnet positioned along opposite and exterior surfaces of the passageway wherein the first and second magnets impose a magnetic field in a transverse direction with respect to a lengthwise axis of the passageway, the transverse magnetic field tending to reduce the potential energy of the charged particles that travel through the passageway.

11. A high voltage system as recited in claim 10 wherein the semi-conductive material layer has resistance of at least 60 Mega-ohms Square.

12. A high voltage system as recited in claim 10 wherein the first and second magnets are oriented such that opposite poles face each other across the passageway.

13. A high voltage system as recited in claim 10 wherein the magnetic field has a strength of at least 2250 gauss within the passageway.

14. A high voltage system as recited in claim 10 wherein the voltage isolating passageway further comprises a pair of pole pieces, each pole piece attached to one of the magnets whereby the pole pieces guide the magnetic field in the transverse direction.

15. A high voltage system as recited in claim 10 wherein the voltage isolating passageway is approximately 6 inches long.

16. A high voltage system as recited in claim 10 wherein the first and second magnets are rare earth magnets.

17. A high voltage system as recited in claim 10 wherein the vacuum chamber contains an electron microscope.

18. A voltage isolating passageway comprising:
    a passageway having two openings, each opening configured to be connected to external components and capable of being sealed such that a low pressure environment can be sustained within the passageway;
    a first and a second magnet positioned along opposite and exterior surfaces of the passageway wherein the first and second magnets impose a magnetic field in a transverse direction with respect to a lengthwise axis of the passageway, the transverse magnetic field tending to reduce the potential energy of charged particles traveling through the passageway;

a semi-conductive material layer that coats an inner surface of the passageway, the semi-conductive material layer acting to absorb at least some of the charged particles that come into physical contact with the inner surface of the passageway; and a pair of pole pieces, each pole piece attached to one of the magnets whereby the pole pieces guide the magnetic field in the transverse direction.

19. A voltage isolating passageway as recited in claim 18 wherein the semi-conductive material layer has resistance of at least 60 Mega Ohms Square.

20. A voltage isolating passageway as recited in claim 18 wherein the first and second magnets are oriented such that opposite poles face each other across the passageway.

21. A voltage isolating passageway as recited in claim 18 wherein the magnetic field has a strength of at least 2250 gauss within the passageway.

22. A voltage isolating passageway as recited in claim 18 wherein the passageway is approximately 6 inches long.

23. A voltage isolating passageway as recited in claim 18 wherein the low pressure environment is a vacuum condition.

24. A voltage isolating passageway as recited in claim 18 wherein the first and second magnets are rare earth magnets.

25. A voltage isolating passageway comprising:

a passageway having two openings, each opening configured to be connected to external components and capable of being sealed such that a low pressure environment can be sustained within the passageway, wherein charged particles having a certain level of potential energy travel through the passageway;

a strip of semi-conductive material attached to a portion of an inner surface of the passageway suitable for absorbing at least some of the charged particles that travel through the passageway;

a resistor connected to the strip of semi-conductive material, wherein the strip of semi-conductive material and the resistor are connected in series with a first end and a second end of the passageway; and a first and a second magnet positioned along opposite and exterior surfaces of the passageway wherein the first and second magnets impose a magnetic field in a transverse direction with respect to a lengthwise axis of the passageway, the transverse magnetic field tending to reduce the potential energy of the charged particles that travel through the passageway.

26. A voltage isolating passageway as recited in claim 25 wherein the first and second magnets are oriented such that opposite poles face each other across the passageway.

* * * * *